United States Patent
Chiang et al.

(10) Patent No.: US 12,224,338 B2
(45) Date of Patent: Feb. 11, 2025

(54) HEMT AND FABRICATING METHOD OF THE SAME

(71) Applicant: UNITED MICROELECTRONICS CORP., Hsin-Chu (TW)

(72) Inventors: Huai-Tzu Chiang, Tainan (TW); Sheng-Hao Lin, Hsinchu County (TW); Yi-Chun Chan, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 277 days.

(21) Appl. No.: 17/214,932

(22) Filed: Mar. 29, 2021

(65) Prior Publication Data
US 2022/0271153 A1  Aug. 25, 2022

(30) Foreign Application Priority Data
Feb. 24, 2021  (CN) .......................... 202110207971.3

(51) Int. Cl.
*H01L 21/31* (2006.01)
*H01L 21/311* (2006.01)
*H01L 29/20* (2006.01)
*H01L 29/66* (2006.01)
*H01L 29/778* (2006.01)
*H01L 29/78* (2006.01)

(52) U.S. Cl.
CPC .... *H01L 29/7786* (2013.01); *H01L 21/31116* (2013.01); *H01L 29/2003* (2013.01); *H01L 29/66462* (2013.01); *H01L 29/7839* (2013.01)

(58) Field of Classification Search
CPC .......... H01L 29/7786; H01L 21/31116; H01L 29/2003; H01L 29/66462; H01L 29/7839
See application file for complete search history.

(56) References Cited

U.S. PATENT DOCUMENTS

| | | | |
|---|---|---|---|
| 9,601,608 B2 | 3/2017 | Tsai | |
| 10,797,168 B1* | 10/2020 | Moens | H01L 29/66462 |
| 2001/0023964 A1* | 9/2001 | Wu | H01L 29/66863 |
| | | | 257/E21.407 |
| 2005/0170574 A1* | 8/2005 | Sheppard | H01L 29/66462 |
| | | | 257/E21.407 |
| 2010/0258841 A1* | 10/2010 | Lidow | H01L 29/66462 |
| | | | 257/192 |
| 2011/0057196 A1* | 3/2011 | Chang | H01L 29/66462 |
| | | | 257/E21.403 |

(Continued)

*Primary Examiner* — Kyoung Lee
(74) *Attorney, Agent, or Firm* — Winston Hsu

(57) ABSTRACT

An HEMT includes a gallium nitride layer. An aluminum gallium nitride layer is disposed on the gallium nitride layer. A gate is disposed on the aluminum gallium nitride layer. The gate includes a P-type gallium nitride and a schottky contact layer. The P-type gallium nitride contacts the schottky contact layer, and a top surface of the P-type gallium nitride entirely overlaps a bottom surface of the schottky contact layer. A protective layer covers the aluminum gallium nitride layer and the gate. A source electrode is disposed at one side of the gate, penetrates the protective layer and contacts the aluminum gallium nitride layer. A drain electrode is disposed at another side of the gate, penetrates the protective layer and contacts the aluminum gallium nitride layer. A gate electrode is disposed directly on the gate, penetrates the protective layer and contacts the schottky contact layer.

17 Claims, 4 Drawing Sheets

(56) References Cited

U.S. PATENT DOCUMENTS

| | | | |
|---|---|---|---|
| 2017/0062581 A1 | 3/2017 | You | |
| 2017/0256626 A1* | 9/2017 | Matsushita | H01L 21/0217 |
| 2018/0308968 A1* | 10/2018 | Miura | H01L 21/02381 |
| 2019/0237551 A1* | 8/2019 | Tanaka | H01L 29/4966 |
| 2021/0210955 A1* | 7/2021 | Jiang | H01L 27/0248 |

* cited by examiner

HEMT AND FABRICATING METHOD OF THE SAME

BACKGROUND OF THE INVENTION

1. Field of the Invention

The present invention relates to a high electron mobility transistor (HEMT) having a schottky contact layer disposed on a P-type gallium nitride layer, and a fabricating method of same.

2. Description of the Prior Art

Due to their semiconductor characteristics, III-V semiconductor compounds may be applied in many kinds of integrated circuit devices, such as high power field effect transistors, high frequency transistors, or HEMTs. In the high electron mobility transistor, two semiconductor materials with different band-gaps are combined and a heterojunction is formed at the junction between the semiconductor materials as a channel for carriers. In recent years, gallium nitride (GaN) based materials have been applied in high power and high frequency products because of their properties of wider band-gap and high saturation velocity.

A two-dimensional electron gas (2DEG) may be generated by the piezoelectric property of the GaN-based materials, and the switching velocity may be enhanced because of the higher electron velocity and the higher electron density of the 2DEG However, during the formation of a gate electrode, a protective layer on a P-type gallium nitride needs to be etched to form a gate electrode contact hole. Since the P-type gallium nitride serves as an etching stop layer, the activity of magnesium dopants within the P-type gallium nitride is reduced. Furthermore, because an alignment window is provided during the formation of the gate electrode contact hole, the schottky contact area between the gate electrode and the P-type gallium nitride become smaller. In this way, resistance between the gate electrode and the P-type gallium nitride is unable to be reduced to an expected value.

SUMMARY OF THE INVENTION

In view of this, the present invention provides an HEMT and a manufacturing method thereof to solve the abovementioned problems.

According to a preferred embodiment of the present invention, An HEMT includes a gallium nitride layer. An aluminum gallium nitride layer is disposed on the gallium nitride layer. A gate is disposed on the aluminum gallium nitride layer, wherein the gate includes a P-type gallium nitride layer and a schottky contact layer, the P-type gallium nitride layer contacts the schottky contact layer, and a top surface of the P-type gallium nitride layer entirely overlaps a bottom surface of the schottky contact layer. A protective layer covers the aluminum gallium nitride layer and the gate. A source electrode is disposed at one side of the gate, penetrates the protective layer and contacts the aluminum gallium nitride layer. A drain electrode is disposed at another side of the gate, penetrates the protective layer and contacts the aluminum gallium nitride layer. A gate electrode disposed directly on the gate, penetrates the protective layer and contacts the schottky contact layer.

A fabricating method of an HEMT includes forming a gallium nitride layer, an aluminum gallium nitride layer, a P-type gallium nitride layer, and a schottky contact layer in sequence, wherein the schottky contact layer contacts P-type gallium nitride layer. Later, an etching process is performed to etch the schottky contact layer and the P-type gallium nitride layer to form a gate by taking the aluminum gallium nitride layer as a first etching stop layer, wherein the P-type gallium nitride layer contacts the schottky contact layer, and a top surface of the P-type gallium nitride layer entirely overlaps a bottom surface of the schottky contact layer. Next, a protectively layer is formed to cover the gate and the aluminum gallium nitride layer. Subsequently, the protective layer is etched to form two first contact holes in the protective layer at two sides of the gate. After that, a source electrode and a drain electrode are formed respectively in the two first contact holes. After forming the source electrode and the drain electrode, the protective layer is etched to form a second contact hole in the protective layer directly on the gate. Finally, a gate electrode is formed in the second contact hole and contacts the schottky contact layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 7 depict a fabricating process of an HEMT according to a preferred embodiment of the present invention, wherein:

FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4;
FIG. 6 is a fabricating stage following FIG. 5;
and
FIG. 7 is a fabricating stage following FIG. 6.

DETAILED DESCRIPTION

FIG. 1 to FIG. 7 depict a fabricating process of an HEMT according to a preferred embodiment of the present invention.

Figure 1:
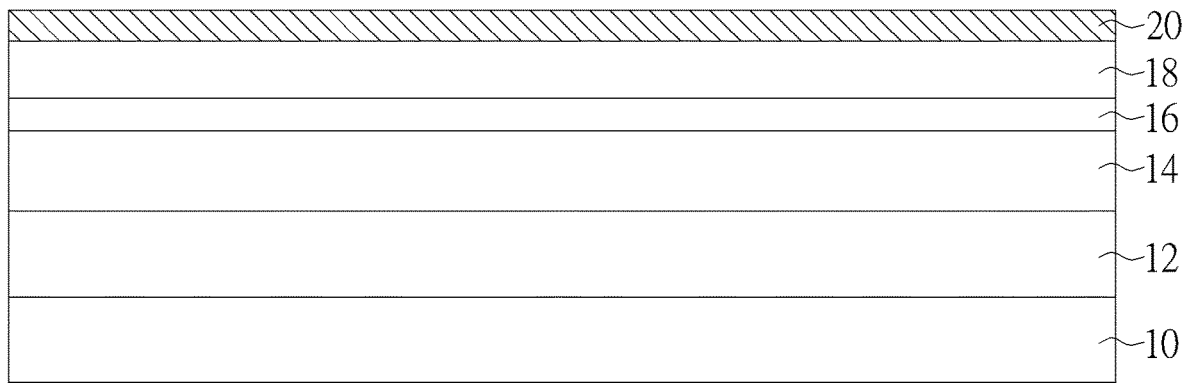

As shown in FIG. 1, a substrate 10 is provided. The substrate 10 includes a sapphire substrate, an SiC substrate or a silicon substrate. According to a preferred embodiment of the present invention, the substrate 10 is a silicon substrate having (1,1,1) facets. Later, a buffering stack layer 12 is formed on the substrate 10. The buffering stack layer 12 includes aluminum nitride, gallium nitride, aluminum gallium nitride or other group III-V compound layer. The buffering stack layer 12 preferably includes numerous material layers. After that, a gallium nitride layer 14, an aluminum gallium nitride layer 16, a P-type gallium nitride layer 18, and a schottky contact layer 20 are formed in sequence on the buffering stack layer 12. The schottky contact layer 20 includes a metal, a metal compound or alloy. A work function of the metal, a work function of the metal compound and a work function of the alloy are smaller than a work function of the P-type gallium nitride layer 18. A work function of the schottky contact layer 20 is preferably smaller than 6.1 electron volts. The schottky contact layer 20 may include TiN, TiW, TaN, Al, Ti, Mo, Au, W, Ni, Pd, Ta, Re, Ru, Pt or Co.

Figure 2:
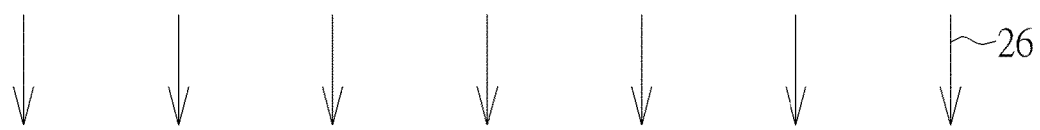
Figure 2:
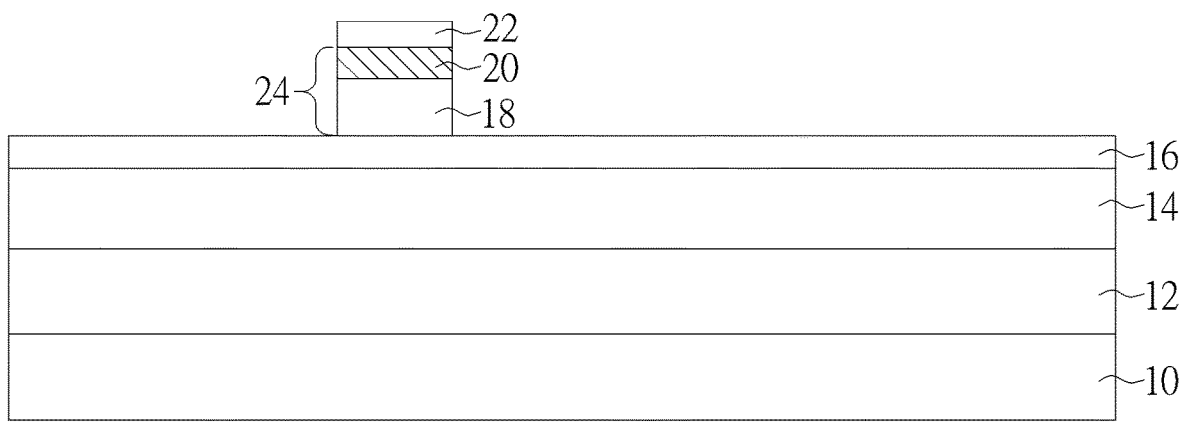

As show in FIG. 2, a patterned mask 22 is formed to cover the schottky contact layer 20 to define a position of a gate 24.

Later, an etching process 26 is performed to etch the schottky contact layer 20 and the P-type gallium nitride layer 18 to form the gate 24 by taking the aluminum gallium nitride layer 16 as an etching stop layer. Because the schottky contact layer 20 and the P-type gallium nitride layer 18 are etched by using the same patterned mask 22, the schottky contact layer 20 entirely overlaps the P-type gallium nitride layer 18 under a top view. That is, a top surface of the P-type gallium nitride layer 18 entirely overlaps a bottom surface of the schottky contact layer 20.

Moreover, during the etching process 26, a first etchant is used to etch the schottky contact layer 20. Then, a second etchant is used to etch the P-type gallium nitride layer 18. In other word, different etchants are respectively used to etch the P-type gallium nitride layer 18 and the schottky contact layer 20. The etching process 26 can include a dry etching, a wet etching or a dry etching and a wet etching by turns. That is, the schottky contact layer 20 can be patterned by using a dry etching or a wet etching, and the P-type gallium nitride layer 18 can be patterned by using a dry etching or a wet etching as long as a suitable etchant is used. The first etchant includes fluorine-containing gas, chlorine-containing gas, $BCl_3/Cl_2$ gas, $CHF_3$ gas, or $HCl/H_2O_2/H_2O$ solution. The second etchant includes KOH/ethylene glycol solution, $HCl/H_2O$ solution, fluorine-containing gas, chlorine-containing gas, $BCl_3/SF_6$ gas, $Cl_2/Ar/O_2$ gas, $Cl_2/N_2$ gas, $N_2/Cl_2/O_2$ gas, or $Cl_2/Ar$ gas. For example, during the etching process 26, the schottky contact layer 20 is etched by introducing $BCl_3/Cl_2$ gas as an etchant followed by changing the etchant to $Cl_2/N_2$ gas to etch the P-type gallium nitride layer 18.

Figure 3:
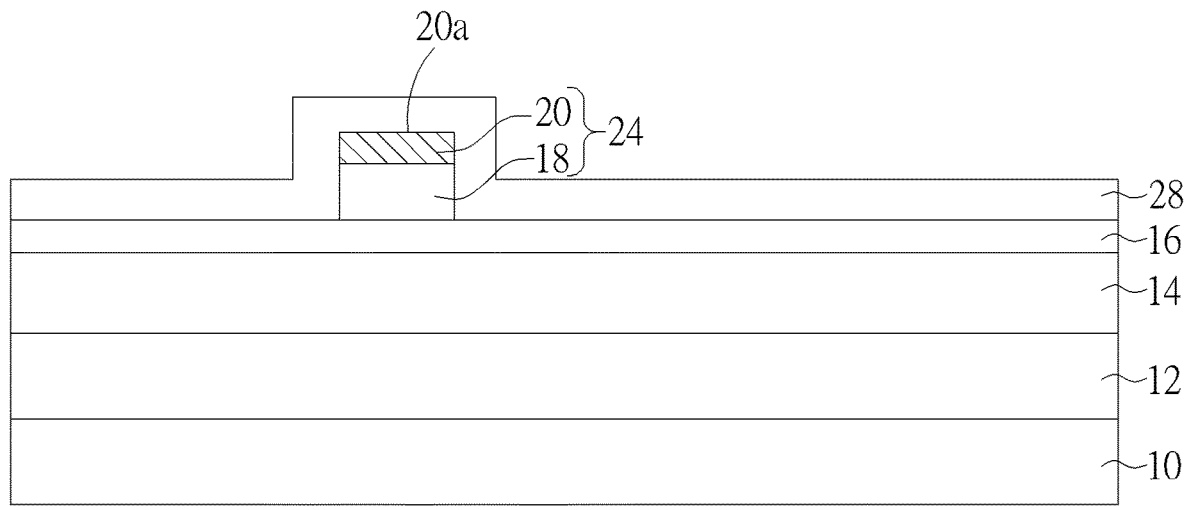
Figure 4:
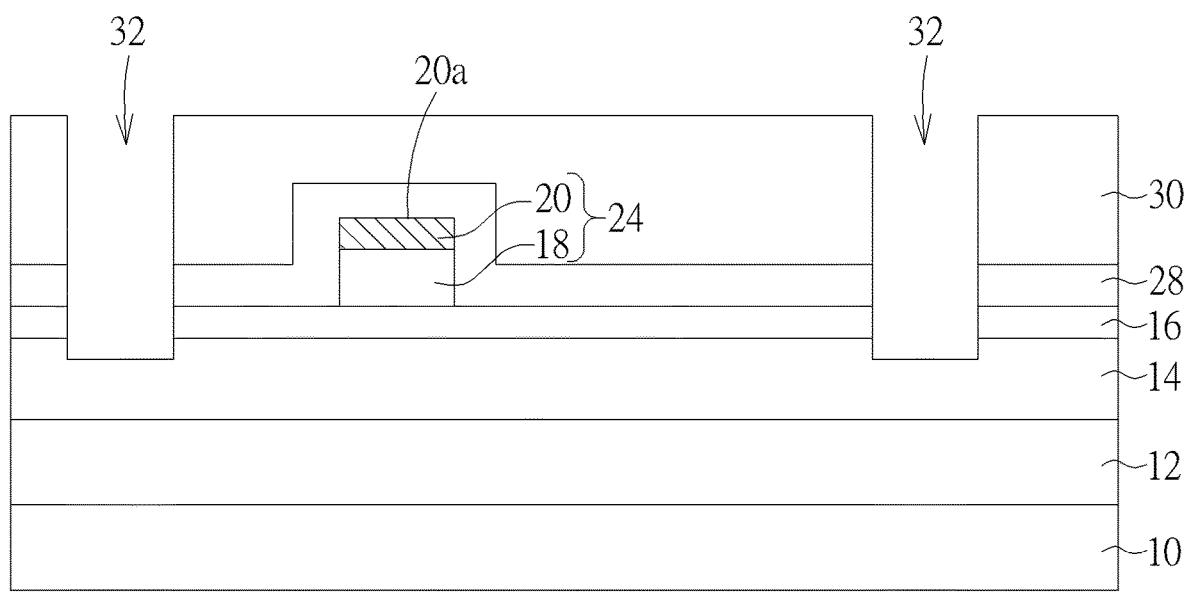

As shown in FIG. 3, the patterned mask 22 is removed. Later, a protective layer 28 is formed to conformally cover the gate 24 and the aluminum gallium nitride layer 16. In details, the protective layer 28 entirely covers and contacts the schottky contact layer 20 and the P-type gallium nitride layer 18 which form the gate 24. The protective layer 28 directly contacts the topmost surface 20a of the schottky contact layer 20. As shown in FIG. 4, a patterned mask 30 is formed to cover the protective layer 28. Openings are set in the patterned mask 30 to define positions of a source electrode and a drain electrode. Later, the protective layer 28, the aluminum gallium nitride layer 16 and the gallium nitride layer 14 are etched by taking the patterned mask 30 as a mask to form two first contact holes 32 in the protective layer 28, the aluminum gallium nitride layer 16 and the gallium nitride layer 14 at two sides of the gate 24.

Figure 5:
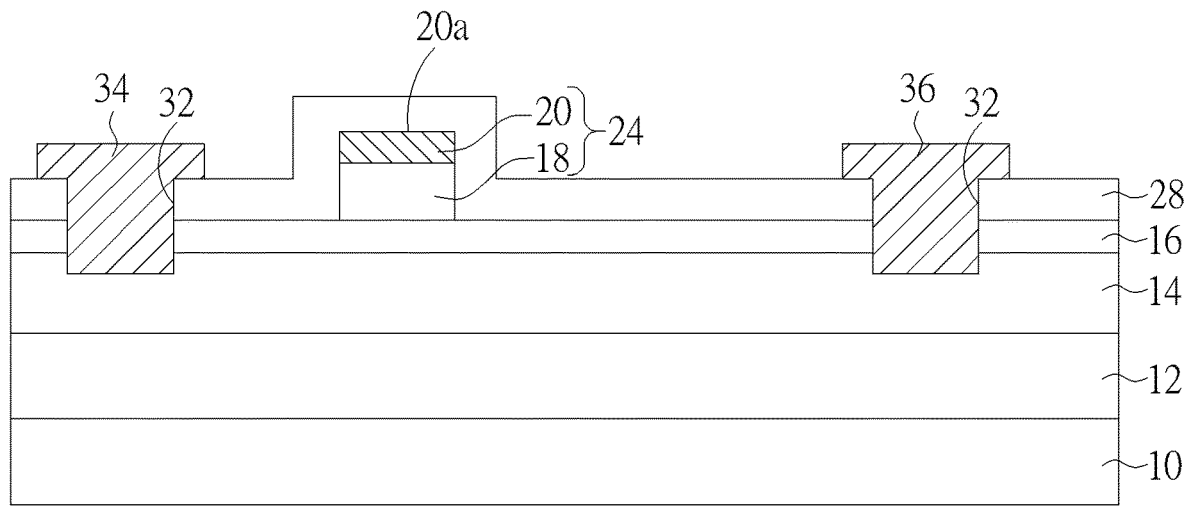

As shown in FIG. 5, after removing the patterned mask 30, a metal layer is formed to fill in the first contact holes 32 and cover the protective layer 28. Later, an etching process is performed to etch the metal layer to form a source electrode 34 and a drain electrode 36 respectively in the first contact holes 32. Subsequently, a thermal process is performed to increase the efficiency of Ohmic contact between the source electrode 34, the aluminum gallium nitride layer 16 and the gallium nitride layer 14, and also to increase the efficiency of Ohmic contact between the drain electrode 36, the aluminum gallium nitride layer 16 and the gallium nitride layer 14. The metal layer can include multiple conductive layers, such as a conductive stacked layer formed by TiN, Cu, Al and Ti stacked from bottom to top. The metal layer can be etched by using fluorine-containing gas as an etchant.

Figure 6:
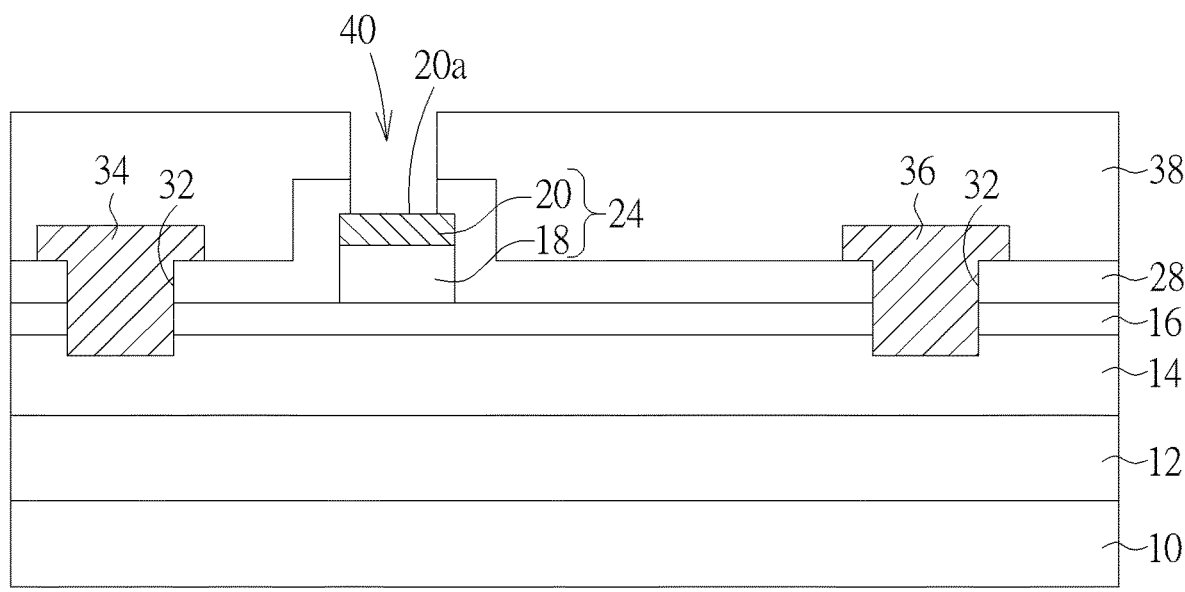
Figure 7:
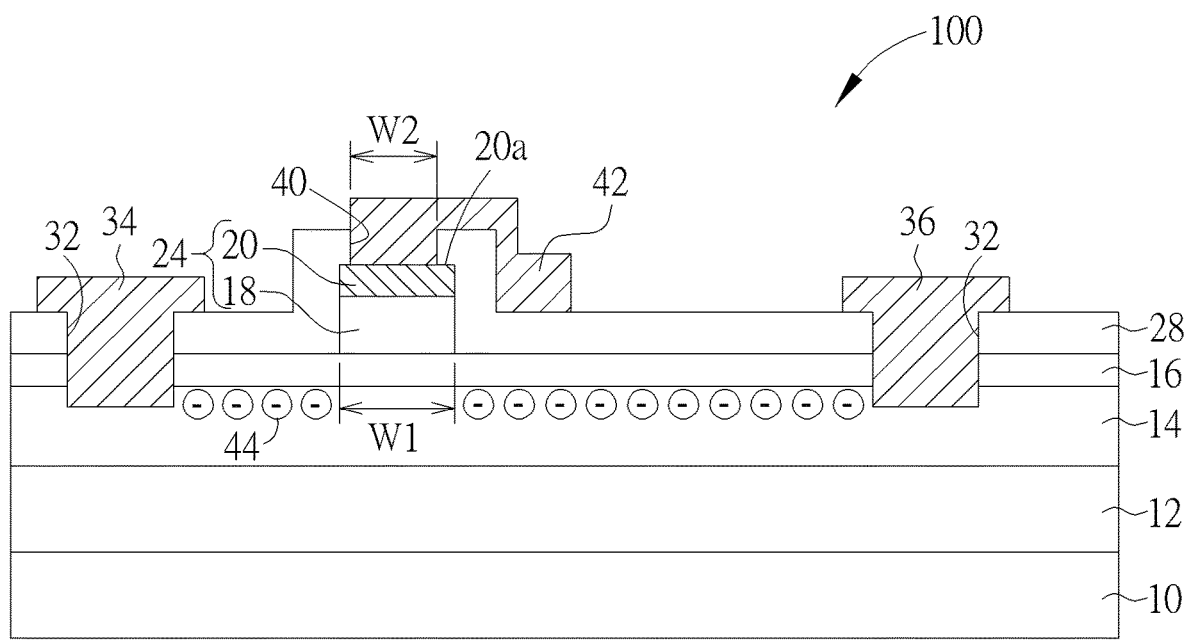

As shown in FIG. 6, a patterned mask 38 is formed to cover the protective layer 28, the source electrode 34 and the drain electrode 36. An opening which defines a position of a gate electrode is arranged in the patterned mask 38. Next, the protective layer 28 is etched by taking the patterned mask 38 as a mask to form a second contact hole 40 directly on the gate 24. The schottky contact layer 20 is exposed through the second contact hole 40. The second contact hole 40 is formed by taking the topmost surface 20a of the schottky contact layer 20 as an etching stop layer rather than taking the P-type gallium nitride layer 18 as an etching stop layer. In this way, Mg dopants in the P-type gallium nitride layer 18 are not damaged by the etchant. As shown in FIG. 7, the patterned mask 38 is removed. After that, a metal layer is formed to fill in the second contact hole 40 and cover the protective layer 28. Then, the metal layer is etched, and the metal layer in the second contact hole 40 is remained to serve as a gate electrode 42. Now, an HEMT 100 of the present invention is completed.

As shown in FIG. 7, an HEMT 100 includes a substrate 10. A buffering stack layer 12 is disposed on the substrate 10. A gallium nitride layer 14 is disposed on the buffering stack layer 12. An aluminum gallium nitride layer 16 is disposed on the gallium nitride layer 14. A gate 24 is disposed on the aluminum gallium nitride layer 16. The gate includes a P-type gallium nitride layer 18 and a schottky contact layer 20. The P-type gallium nitride layer 18 contacts the schottky contact layer 20. A top surface of the P-type gallium nitride layer 18 entirely overlaps a bottom surface of the schottky contact layer 20. A protective layer 28 covers the aluminum gallium nitride layer 16 and the gate 24. Furthermore, the protective layer 28 contacts a topmost surface 20a of the schottky contact layer 20. A source electrode 34 is disposed at one side of the gate 24, penetrates the protective layer 28 and contacts the aluminum gallium nitride layer 16. A drain electrode 36 is disposed at another side of the gate 24, penetrates the protective layer 28 and contacts the aluminum gallium nitride layer 16. A gate electrode 42 is disposed directly on the gate 24, penetrates the protective layer 28 and contacts the topmost surface 20a of the schottky contact layer 20. The substrate 10 includes a sapphire substrate, an SiC substrate or a silicon substrate. The HEMT 100 is preferably a normally-off HEMT. A two-dimensional electron gas (2DEG) 44 occurs within the aluminum gallium nitride layer 16. According to a preferred embodiment of the present invention, the substrate 10 is a silicon substrate having (1,1,1) facets. The buffering stack layer 12 includes aluminum nitride, gallium nitride, aluminum gallium nitride or other group III-V compound layer. The schottky contact layer 20 includes a metal, a metal compound or alloy, a work function of the metal, a work function of the metal compound and a work function of the alloy are smaller than a work function of the P-type gallium nitride layer 18. A work function of the schottky contact layer 20 is smaller than 6.1 electron volts. The schottky contact layer 20 includes TiN, TiW, TaN, Al, Ti, Mo, Au, W, Ni, Pd, Ta, Re, Ru, Pt or Co. According to a preferred embodiment of the present invention, the schottky contact layer 20 is TiN. A thickness of the schottky contact layer 20 is greater than 50 angstroms. In this embodiment, the thickness of the schottky contact layer 20 is 100 angstroms, and a thickness of the P-type gallium nitride layer 18 is 800 angstroms.

The protective layer 28 includes silicon nitride or silicon oxide. The drain electrode 36 and the source electrode 34 respectively include TiN, Cu, Al, Ti, Ta, W, WN, Co or Ni. Preferably, the drain electrode 36 and the source electrode 34 are respectively of multiple conductive layers, such as a conductive stacked layer formed by TiN, Cu, Al and Ti stacked from bottom to top. The gate electrode 42 includes Ti, Al or Cu.

An alignment window is provided while forming the second contact hole 40. Therefore, the protective layer 28 formed afterward contacts part of the top surface of the gate 24. Moreover, an interface is between the schottky contact layer 20 and the P-type gallium nitride layer 18 has a first width W1, an interface between the schottky contact layer 20 and the gate electrode 42 has a second width W2. Because the protective layer 28 covers part of the top surface of the gate 24, the second width W2 is smaller than the first width W1. Although the gate electrode 42 doesn't contact the entire top surface of the gate 24, however, schottky contact is already formed between the schottky contact layer 20 and the P-type gallium nitride layer 18. In this way, the resistance between the P-type gallium nitride layer 18 and the gate electrode 42 will not increase because of the alignment window. In this embodiment, the first width W1 is 2 and the second width W2 is 12 but not limited to them.

Figure 8:
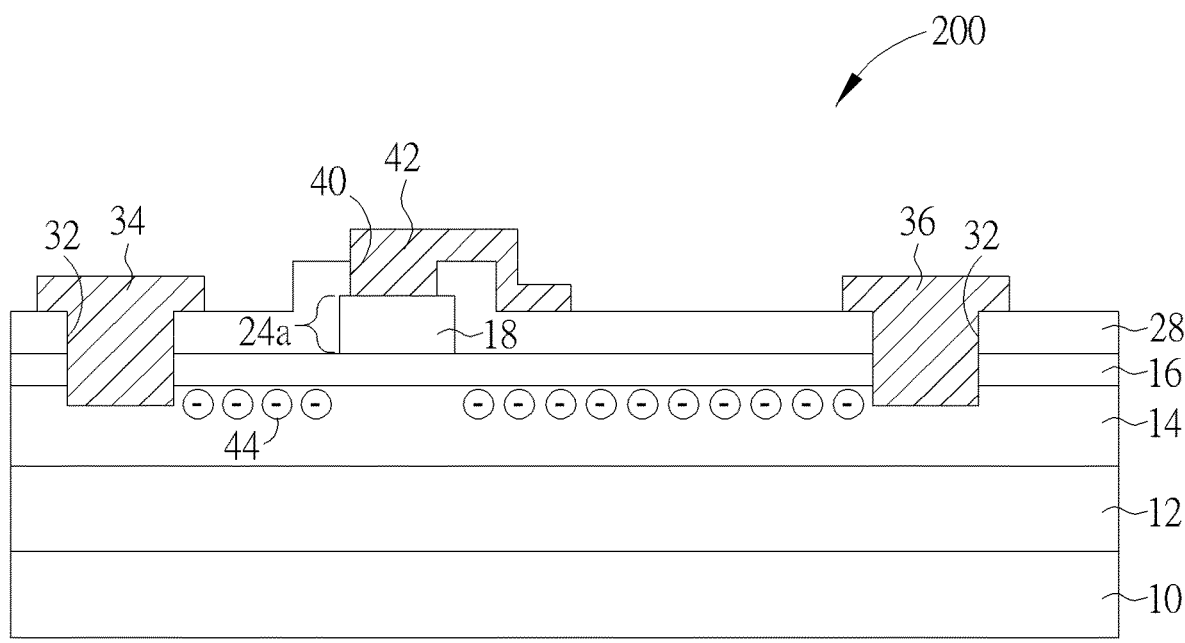
FIG. 8 depicts an HEMT according to an example of the present invention.

FIG. 8 depicts an HEMT according to an example of the present invention, wherein elements which are substantially the same as those in the embodiment of FIG. 7 are denoted by the same reference numerals; an accompanying explanation is therefore omitted. The difference between the HEMT 200 and HEMT 100 is that the gate 24 of the HEMT 200 is formed only by the P-type gallium nitride layer 18, and the protective layer 28 covers part of the top surface of the P-type gallium nitride layer 18. Therefore, the gate electrode 42 doesn't contact the entire top surface of the P-type gallium nitride layer 18. That is, part of the surface of the P-type gallium nitride layer 18 does not have schottky contact. In this way, comparing to the HEMT 100, the resistance between the gate electrode 42 and the gate 24 of the HEMT 200 is larger.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:
   a gallium nitride layer;
   an aluminum gallium nitride layer disposed on the gallium nitride layer;
   a gate disposed on the aluminum gallium nitride layer, wherein the gate consists of a P-type gallium nitride layer and a schottky contact layer, the P-type gallium nitride layer contacts the schottky contact layer, an entirety of the schottky contact layer does not contact the aluminum gallium nitride layer and a top surface of the P-type gallium nitride layer entirely overlaps a bottom surface of the schottky contact layer;
   a protective layer covering the aluminum gallium nitride layer and the gate, wherein the protective layer contacts a topmost surface of the schottky contact layer;
   a source electrode disposed at one side of the gate, penetrating the protective layer and contacting the aluminum gallium nitride layer;
   a drain electrode disposed at another side of the gate, penetrating the protective layer and contacting the aluminum gallium nitride layer; and
   a gate electrode disposed directly on the gate, penetrating the protective layer and contacting the topmost surface of the schottky contact layer.

2. The HEMT of claim 1, wherein the schottky contact layer comprises a metal, a metal compound or alloy, a work function of the metal, a work function of the metal compound and a work function of the alloy are smaller than a work function of the P-type gallium nitride layer.

3. The HEMT of claim 1, wherein a work function of the schottky contact layer is smaller than 6.1 electron volts.

4. The HEMT of claim 1, wherein the schottky contact layer comprises TiN, TiW, TaN, Al, Ti, Mo, Au, W, Ni, Pd, Ta, Re, Ru, Pt or Co.

5. The HEMT of claim 1, wherein a thickness of the schottky contact layer is larger than 50 angstroms.

6. The HEMT of claim 1, wherein an interface between the schottky contact layer and the P-type gallium nitride layer has a first width, an interface between the schottky contact layer and the gate electrode has a second width, and the second width is smaller than the first width.

7. The HEMT of claim 1, wherein the gate electrode comprises Al, Cu or Ti, the source electrode and the drain electrode respectively comprises Al, Cu, Ti or TiN.

8. The HEMT of claim 1, wherein the protective layer comprises silicon nitride or silicon oxide.

9. The HEMT of claim 1, wherein the protective layer covers part of a top surface of the gate.

10. A fabricating method of a high electron mobility transistor (HEMT), comprising:
    forming a gallium nitride layer, an aluminum gallium nitride layer, a P-type gallium nitride layer, and a schottky contact layer in sequence, wherein the schottky contact layer contacts P-type gallium nitride layer;
    performing an etching process to etch the schottky contact layer and the P-type gallium nitride layer to form a gate by taking the aluminum gallium nitride layer as a first etching stop layer, wherein the P-type gallium nitride layer contacts the schottky contact layer, and a top surface of the P-type gallium nitride layer entirely overlaps a bottom surface of the schottky contact layer;
    forming a protectively layer covering the gate and the aluminum gallium nitride layer;
    etching the protective layer to form two first contact holes in the protective layer at two sides of the gate;
    forming a source electrode and a drain electrode respectively in the two first contact holes;
    after forming the source electrode and the drain electrode, etching the protective layer to form a second contact hole in the protective layer directly on the gate; and
    forming a gate electrode in the second contact hole and contacting the schottky contact layer.

11. The fabricating method of the HEMT of claim 10, wherein the schottky contact layer comprises a metal, a metal compound or alloy, a work function of the metal, a work function of the metal compound and a work function of the alloy are smaller than a work function of the P-type gallium nitride layer.

12. The fabricating method of the HEMT of claim 10, wherein a work function of the schottky contact layer is smaller than 6.1 electron volts.

13. The fabricating method of the HEMT of claim 10, wherein the schottky contact layer comprises TIN, TiW, TaN, Al, Ti, Mo, Au, W, Ni, Pd, Ta, Re, Ru, Pt or Co.

14. The fabricating method of the HEMT of claim 10, wherein a thickness of the schottky contact layer is larger than 50 angstroms.

15. The fabricating method of the HEMT of claim 10, wherein the etching process comprises a dry etching or a wet etching.

16. The fabricating method of the HEMT of claim 10, wherein the etching process comprises:
    etching the schottky contact layer by a first etchant;

after etching the schottky contact layer, etching the P-type gallium nitride layer by a second etchant, wherein the first etchant is different from the second etchant.

17. The fabricating method of the HEMT of claim 16, wherein the first etchant comprises fluorine-containing gas, chlorine-containing gas, $BCl_3/Cl_2$ gas, $CHF_3$ gas, or $HCl/H_2O_2/H_2O$ solution, the second etchant comprises $KOH/$ ethylene glycol solution, $HCl/H_2O$ solution, fluorine-containing gas, chlorine-containing gas, $BCl_3/SF_6$ gas, $Cl_2/Ar/O_2$ gas, $Cl_2/N_2$ gas, $N_2/Cl_2/O_2$ gas, or $Cl_2/Ar$ gas.

* * * * *